US012592670B2

(12) United States Patent
Akter et al.

(10) Patent No.: US 12,592,670 B2
(45) Date of Patent: Mar. 31, 2026

(54) EFFICIENT COMMON MODE SUPPRESSION FOR TRANSMISSION SYSTEMS

(71) Applicant: Avago Technologies International Sales Pte. Limited, Singapore (SG)

(72) Inventors: Md Shakil Akter, Bunnik (NL); Jan Mulder, Bunnik (NL); Han Yan, Bunnik (NL)

(73) Assignee: Avago Technologies International Sales Pte. Limited, Singapore (SG)

( * ) Notice: Subject to any disclaimer, the term of this patent is extended or adjusted under 35 U.S.C. 154(b) by 432 days.

(21) Appl. No.: 18/304,981

(22) Filed: Apr. 21, 2023

(65) Prior Publication Data

US 2023/0353103 A1 Nov. 2, 2023

Related U.S. Application Data

(60) Provisional application No. 63/335,913, filed on Apr. 28, 2022.

(51) Int. Cl.
*H03F 3/19* (2006.01)

(52) U.S. Cl.
CPC ......... *H03F 3/19* (2013.01); *H03F 2200/451* (2013.01)

(58) Field of Classification Search
CPC ...... H03F 3/19; H03F 2200/451; H03F 3/193; H03F 2203/45404; H03F 2203/45418; H03F 3/303; H03F 3/45192; H03F 3/45654; H03F 3/45659; H03F 3/45188
See application file for complete search history.

(56) References Cited

U.S. PATENT DOCUMENTS

2021/0013851 A1* 1/2021 Dabrowski ......... H03F 3/45192

* cited by examiner

*Primary Examiner* — Andrea Lindgren Baltzell
*Assistant Examiner* — Malane Lieng
(74) *Attorney, Agent, or Firm* — Foley & Lardner LLP

(57) ABSTRACT

In some aspects, the disclosure is directed to methods and systems for an amplifier having common mode feedback inputs. The inputs are coupled to various points within an amplifier wherein a first set of directly coupled common mode feedback inputs join the amplifier one or more nodes, and a second set of capacitively coupled common mode feedback inputs are joined to the amplifier at one or more different nodes.

20 Claims, 8 Drawing Sheets

EFFICIENT COMMON MODE SUPPRESSION FOR TRANSMISSION SYSTEMS

CROSS-REFERENCE TO RELATED APPLICATION

The present application claims priority to U.S. Provisional Patent Application No. 63/335,913, filed Apr. 28, 2022, the entire contents of which are incorporated by reference in their entirety.

FIELD OF THE DISCLOSURE

This disclosure generally relates to systems and methods for common mode suppression. In particular, this disclosure relates to systems and methods for suppressing wideband common mode interference at an amplifier.

BACKGROUND OF THE DISCLOSURE

Modern electronic devices continue to increase in complexity, interconnectivity, and functionality. For example, industrial machines, automobiles, and personal electronic devices continue to form networks. The internet of things (IOT) is one example of the increasing interconnectivity of devices.

In addition to the increasing interconnectivity of devices, data continues to be of increasing importance. For example, in automotive and industrial systems, as well as personal devices such as wearable devices, frequent data collection and transmission may enable various prognostics and analytics of machinery, vehicles, and people. Such data collection may be over a wide variety of wired and wireless communication channels such as various Ethernet protocols, USB, CAN, Bluetooth, Zigbee, and numerous other protocols, each of which may have one or more associated physical layer standards which must inter-operate.

Although substantial efforts are made to prevent inter-device interference, various protocols may sometimes interfere with communications channels. For example, a wired or wireless communication channel may couple to another communication channel, causing interference. In additional to aggressor communication channels, various environmental interferences, such as ignition coils, motors including stepper motors, bus bars, etc. may couple to a communications channel and thereby degrade performance. Although sophisticated strategies and circuits are used to minimize the impact of these issues, advances are needed in the state of the art.

SUMMARY OF THE DISCLOSURE

Common mode signals can ride along differential pairs such that the differential signal is maintained. However, various amplifiers can exhibit non-linear amplification of shifted signals, or otherwise amplify common mode signals. Such amplification can result in incorrect registering of bit values, an amplification of common mode noise which can couple into further circuits, or damage to a circuit, wherein a voltage level can exceed a limit. A dedicated common mode amplifier can provide common mode suppression, however, such an amplifier can be duplicative of a main differential amplifier. According to systems and methods of the present disclosure, various constituent portions of a common mode signal can be injected into the main amplifier to suppress common mode signals, reusing existing circuits to reduce die area, energy use, complexity, and the like relative to systems employing dedicated common mode suppression amplifiers.

An embodiment of the present disclosure is directed to an amplifier. The amplifier includes a first amplifier stage. The first amplifier stage includes a pair of differential input ports configured to receive a differential input signal at a first pair of gates of a first pair of transistors. The first amplifier stage includes a pair of reference input ports configured to receive a common mode reference at a second pair of gates of a second pair of transistors. The first amplifier stage includes a first pair of inter-stage outputs configured to deliver a pair of amplified signals from the first amplifier stage to a pair of gates of a third pair of transistors of a second amplifier stage. The amplifier includes a second amplifier stage. The second amplifier stage includes a first pair of current sources. The second amplifier stage includes a second pair of current sources. The second amplifier stage includes a feedback network coupled between an output of the amplifier and a stage of the amplifier. The feedback network includes a first pair of feedback inputs directly coupled to the first amplifier stage, or a second pair of feedback inputs capacitively coupled to the first pair of current sources, or a third pair of feedback inputs capacitively coupled to the second pair of current sources.

Another embodiment of the present disclosure is directed to a system. The system includes a first amplifier stage of an amplifier. The first amplifier stage includes a pair of differential input ports configured to receive a differential input signal at a first pair of gates of a first pair of transistors. The first amplifier stage includes a pair of reference input ports configured to receive a common mode reference at a second pair of gates of a second pair of transistors. The first amplifier stage includes a first pair of inter-stage outputs configured to deliver a pair of amplified signals from the first amplifier stage to a pair of gates of a third pair of transistors of a second amplifier stage. The system includes the second amplifier stage. The second amplifier stage includes a first pair of high side current sources. The second amplifier stage includes a second pair low side of current sources. The second amplifier stage includes a feedback network coupled between an output of the amplifier and a stage of the amplifier. The feedback network includes a first pair of feedback inputs directly coupled to the first amplifier stage. The feedback network includes a second pair of feedback inputs capacitively coupled to the first pair of high side current sources. The feedback network includes a third pair of feedback inputs capacitively coupled to the second pair of low side current sources.

Yet another embodiment of the present disclosure is directed to a method. The method includes receiving, at a first stage of a differential amplifier a differential data signal at first input gates of first transistors of respective portions of the first stage. The method includes receiving, at a first stage of a differential amplifier, a common mode reference signal at second input gates of second transistors of respective portions of the first stage. The method includes receiving, at a first stage of a differential amplifier, a first differential feedback input at third inputs intermediate to the first transistors and the second transistors. The method includes generating, by the first stage of the differential amplifier, a differential inter-stage output based on the differential data signal, the common mode reference signal, and the first differential feedback input. The method includes receiving, by the second stage of the differential amplifier, a second differential feedback input at a high side current source at respective portions of the second stage. The method includes receiving, by the second stage of the differential amplifier, a third differential feedback input at a low side current source at respective portions of the second stage. The differential inter-stage output can be intermediate to the high side current source and the low side current source at respective portions of the second stage. The method includes generating, by the second stage of the differential amplifier, an output based on the differential inter-stage output, the second differential feedback input, and the third differential feedback input.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

Figure 1:
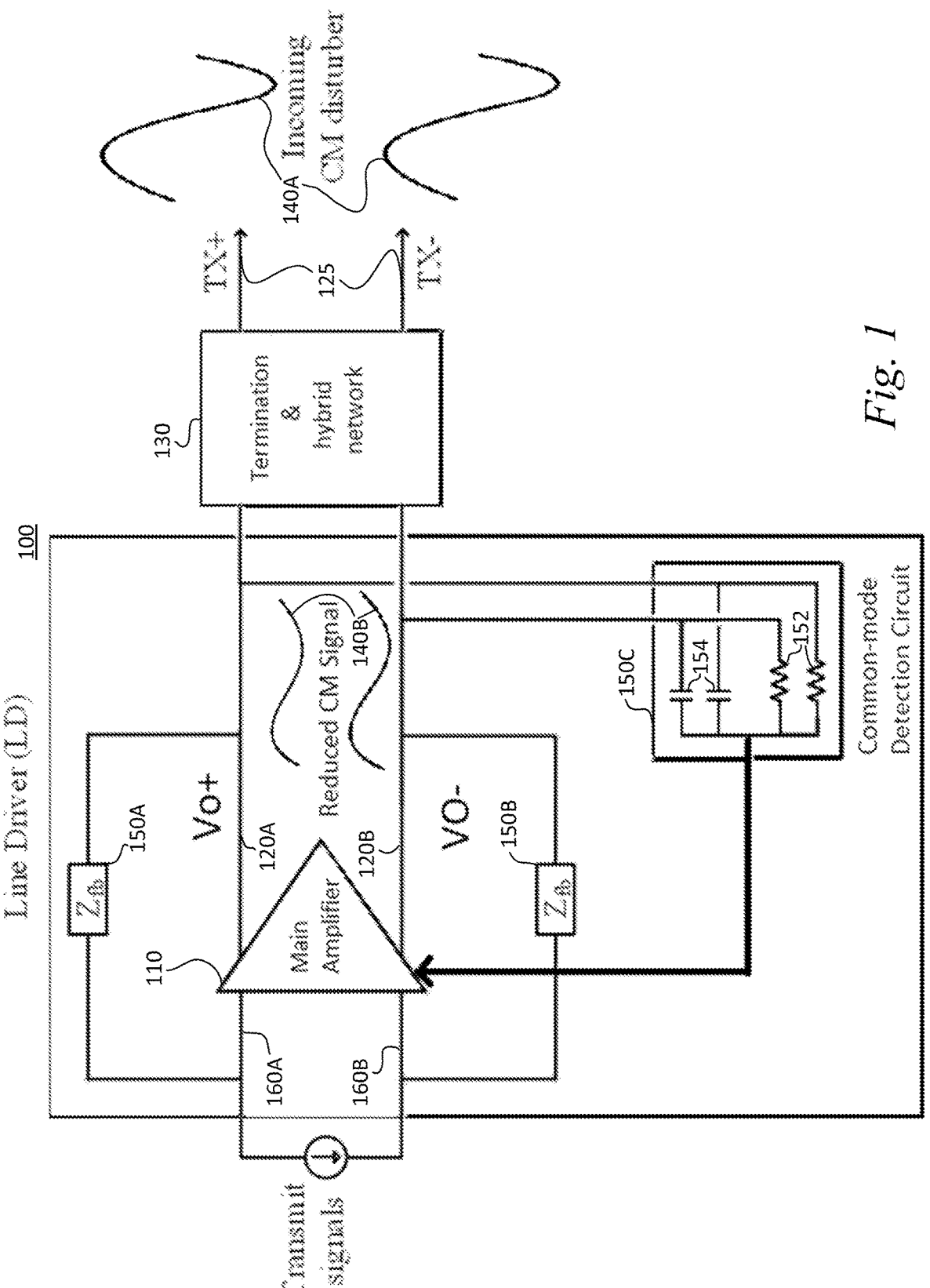
FIG. 1 is an illustration of a circuit including a differential amplifier driving a transmission line coupled to common mode interference, according to some implementations.

The details of various embodiments of the methods and systems are set forth in the accompanying drawings and the description below.

DETAILED DESCRIPTION

The following IEEE standard(s), including any draft versions of such standard(s), are hereby incorporated herein by reference in their entirety and are made part of the present disclosure for all purposes: WiFi Alliance standards and IEEE 802.3 standards including but not limited to IEEE P802.3i™; IEEE P802.3ab™; IEEE P802.3bw™. Although this disclosure may reference aspects of these standard(s), the disclosure is in no way limited by these standard(s). Although this disclosure can reference aspects of these standard(s), the disclosure is in no way limited by these standard(s). For example, various communication or power applications may include amplifiers employing the systems and methods disclosed herein.

For purposes of reading the description of the various embodiments below, the following descriptions of the sections of the specification and their respective contents can be helpful:

Section A describes embodiments of systems and methods for common mode suppression; and Section B describes a network environment and computing environment which may be useful for practicing embodiments described herein.

A. Common Mode Suppression

A line driver may comprise an amplifier to condition a signal, such as a signal drive strength or a single voltage. In communication channels, communication links may be victimized by aggressor/disturber signals coupled to the line. For example, a network may comprise an Ethernet network (e.g., an automotive Ethernet network), having one or more twisted pairs for differential communication. Various common mode signals may couple into Ethernet cables. For example, power supplies of one or more devices on the network may couple directly to the cables, such as by riding along a shielding thereof, even where isolation is provided (e.g., by inadequate isolation between two various ground planes). Networks protocols or implementations forgoing port isolation may further contribute to such contributions. Moreover, even properly isolated ports may couple noise from environmental factors such as motors, power cabling, or communications cabling. Indeed, in many environments, various cables may be routed through similar paths (e.g., due to mechanical constraints) resulting in a large surface area for aggressor/disturber signals coupling to the transmission line.

Because a wide variety of signals may couple to the transmission line, a wide variety of frequencies must be accounted for. For example, the output from an ignition coil or a lightning strike may approximate a Dirac function, whereas a single speed motor or an associated bus bar may be associated with a fixed frequency (e.g., 50 Hz). In some embodiments, an aggressor signal may be known and characterized, in which case rejection of certain frequencies may be of greater interest than others. In some embodiments, such as a vehicle integrating various electronic devices, it may be difficult or impractical to characterize all potential aggressor signals. At sufficient amplitude, common mode signals may interfere with communication, and/or may result in hardware failure (e.g., by exceeding an isolation voltage associated with a communications port).

Thus, it may be desirable to provide a plurality of feedback inputs for common mode signals into an amplifier, to allow for the rejection of said common mode signals. A "feedback input" may refer to a conductive element conveying an output signal to an input of a circuit. For example, the output signal can provide an indication of the performance of the circuit, or a transformation applied to the circuit by an aggressor signal. By selectively introducing common mode signals, such rejection/suppression may be achieved using existing components of the line-driver amplifier. For example, the systems and methods of the present disclosure may omit a dedicated common mode amplifier to suppress common mode signals. Such an omission may reduce a surface area of a semiconductor die, lower power use, reduce complexity, reduce an exposure of active circuit elements to transient signals which can degrade a performance thereof, and the like. For example, a circuit can include inputs to directly couple low frequency common mode feedback, and separate inputs to capacitively couple higher frequency feedback.

FIG. 1 depicts an embodiment of a circuit 100 including an amplifier 110 driving a transmission line 125 coupled to a common mode interface 140. The depicted amplifier 110 is a differential amplifier which outputs a differential signal 120 comprising a positive output 120A component and negative output 120B component. The positive and negative reference are intended merely to describe the signals with reference to each other. Although in many embodiments, the positive and negative signals may also be positive and negative in reference to one or more ground or other reference signals, such embodiments are not limiting.

A termination network 130 can intermediate an output of an amplifier 110 from a transmission line 125 such that the output signal may pass through a termination network 130. For example, the amplifier output may pass through a near end termination network having a termination impedance approximating the characteristic impedance of the transmission line, or to a far end termination network having a similar termination impedance. For example, the termination impedance may be 50, 90, or 100 Ω. The example termination impedances enumerated herein are merely illustrative, and the termination impedance may comprise a wide variety of networks comprising further reactive components. Thus, common mode signals 140 may be conditioned (e.g., damped) by a termination network such that the common mode signal coupled to a cable or other transmission line 125 (e.g., a shielded or unshielded twisted pair cable for a differential signal, wireless link, or other transmission line) may be different in amplitude or other characteristic relative to the common mode signal as seen at the output of the amplifier 110.

Some embodiments may omit the termination network 130. For example, the amplifier 110 may drive a transmission line 125 without an intermediating termination network 130. For example, a connection between collocated printed circuit board assemblies, or within a printed circuit board assembly may omit a termination network between transmit and receive signals based on a required signal integrity. In general, an amplifier generating or receiving a waveform having a relatively slow slew rate, or which is connected at distance permitting any signals to be registered prior to the receipt of reflections, may omit a termination network 130.

Common mode signals (e.g., the depicted incoming common mode disturber 140A or reduced common mode signal 140B) may be coupled onto the transmission line 125 from a variety of sources. For example, aggressor communication lines may couple onto a transmission cable (e.g., to the signal conductors directly, to a cable shield which is, in turn coupled to the signal conductors). Such aggressor lines may be associated with the same communications link (e.g., may be additional differential pairs of a same link, including certain Ethernet, PCIe, and USB topographies). Aggressor lines may be different communication channels, or may be other sources such as power supplies, power cabling, lighting strikes, other transient environmental interference, etc. In many embodiments, the transmission lines may be configured to avoid differential interference between the lines. For example, a differential pair may be routed symmetrically and adjacently; pairs of the differential pair may be configured as a twisted pair, etc. Although such measures may mitigate differential mode interference between the conductors of the differential pair, they may also result in undesirable common mode coupling to the differential pair. This common mode signal may, in some embodiments, be an aggressor signal to other communication links, lead to differential mode issues due to amplifier non-linearity, exceed regulatory emission requirements, etc. Thus, it may be desirable to adjust an output of the amplifier 110 to negate a common mode signal 140B coupled thereto.

An amplifier 110 configured to output a differential signal may include feedback to prevent differential mode disturbances. For example, a differential feedback impedance network 150A may join the positive output 120A with a first input 160A. A second feedback impedance 150B may join the negative output 120B with a second input 160B. In many embodiments, the first feedback impedance 150A and second feedback impedance 150B are equal, such that the differential feedback is symmetrical.

The depicted circuit includes a common mode feedback portion of the circuit comprising a common mode feedback impedance network 150C to convey an indication of the common mode signal coupled to the line to the amplifier 110, and improve the common mode rejection of the amplifier 110. The common mode feedback impedance network 150C may introduce a common mode signal 140 from the near side of the termination network 130 to the amplifier 110, such that the amplifier 110 may compensate for the common mode signal 140. Advantageously, the inclusion of the common mode feedback impedance network 150C inside of the termination may avoid various signal integrity issues along the transmission line 125 (e.g., reflections from the common mode feedback impedance network 150C). In some embodiments, the common mode feedback impedance network 150C may be coupled outside of the termination network 130 which may receive a signal of larger amplitude or drive strength.

The depicted common mode feedback impedance network 150C includes a pair of resistors 152 configured to introduce low frequency (e.g., direct current (DC)) common mode feedback to the amplifier 110. Such a resistive feedback coupling may be termed "directly coupled" or "DC coupled" herein. In some embodiments, a plurality of resistor pairs 152 may be included to introduce the feedback to multiple points within the amplifier. An output from a single pair of resistors 152 may be introduced at multiple points within the amplifier. In some embodiments, the resistor pair 152 may be supplemented (e.g., by an inductor) to reject high frequency signals through the DC coupled path. An amplifier 110 may couple lower frequency feedback separately from higher frequency feedback, such as according to the bandwidth of the amplifier 110, or of one or more stages of the amplifier 110. A "stage" of an amplifier may refer to a portion of the amplifier providing a gain for a signal, which can include one or more transistors. For example, a first stage may provide a first gain to a signal, and a second stage may provide a second gain to the signal such that total signal gain can be determined by multiplying the first and second gain. A gain may be a current gain, voltage gain, or so forth. Stages may have varying bandwidths such that a first gain may apply to a first portion of the signal, and the second gain may apply to a second portion of the signal.

The common mode feedback impedance network 150C also comprises a pair of capacitors 154 configured to introduce relatively high frequency signals (which may be referred to herein, as "capacitively coupled") to the amplifier 110. The pair of capacitors 154 (and/or the resistors 152) may be configured (e.g., based on a capacitance/resistance value) to introduce signals of various frequencies into the amplifier 110. In some embodiments, a plurality of pairs of capacitors 154 may introduce relatively high frequency signals to various positions within the amplifier 110, and/or it's associated ports. The various capacitor pairs 154 may be equal or may be different (e.g., to better couple desired frequency ranges to various positions within the amplifier 110.). Alternatively, or in addition, an output from a single pair of capacitors 154 may be introduced at multiple points within the amplifier.

According to various embodiments, components (e.g., capacitors, resistors, inductors, or the like) of the common mode feedback impedance network 150C can include discrete components or may be integral to a same device as the amplifier 110. For example, a semiconductor device including the amplifier 110 can include a plurality of ports to interface with the common mode feedback impedance network 150C, differential feedback impedance network 150A, or the like. A semiconductor device including the amplifier 110 can include at least a portion of the feedback impedance network 150C and the differential feedback impedance network 150A, which may reduce a number of ports, pins, landings or other terminals of the semiconductor device. For example, the feedback networks can be instantiated in a same silicon die, in an integrated passive device (IPD) or the semiconductor device, or the like.

In some embodiments, the common mode feedback impedance network 150C may include additional or fewer component. For example, the feedback signals may include an amplifier, buffer, or various filters (e.g., high pass, low pass, band pass, band reject) intended to control the frequency of feedback delivered to an amplifier. For example, if a common mode signal of 60 Hz is desired (e.g., to transmit a signal over an AC power line), the common mode feedback impedance network 150C may comprise a band pass filter to reject feedback from 40 Hz to 75 Hz. Some embodiments of the common mode feedback impedance network 150C may omit an amplifier, which may reduce a component count for discrete circuits, or a surface area, transistor count, or power usage for semiconductor devices. As described above, various components can be integral to a same device as the amplifier, or can be connected thereto. "Integral" may refer to a component being integrated into, and not readily separable from, a larger assembly. For example, various components disposed on a same semiconductor die, semiconductor package, or circuit board may be referred to as integral to the semiconductor die, semiconductor package, or circuit board, respectively.

Figure 2:
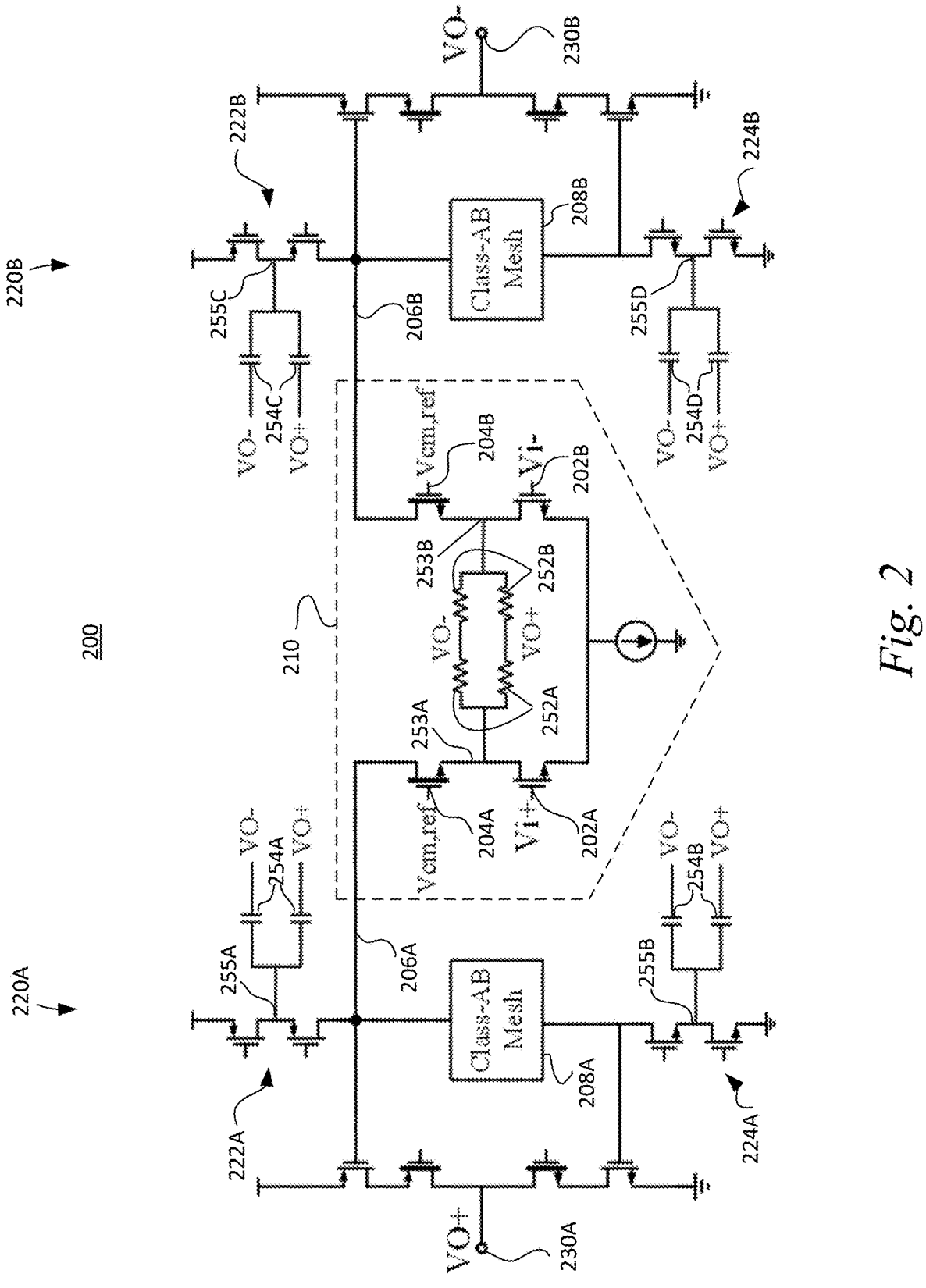
FIG. 2 is an illustration of a differential amplifier having a primary and additional stage, according to some implementations.

FIG. 2 illustrates an embodiment of an amplifier 200 having a primary stage 210 and an additional stage 220. For example, the amplifier 200 may be the amplifier 110 depicted in FIG. 1. The amplifier 200 may be a class AB amplifier, a class B amplifier (not depicted), or another amplifier type. The primary stage 210 (e.g., input stage) can receive an input signal at input signal ports 202 and a separate common mode reference at common mode reference input ports 204. A "common mode reference" may refer to a reference voltage level which is shared between a pair of inputs or outputs, according to some embodiments. For example, the common mode reference may be a ground or a DC offset therefrom. The primary stage amplifier output 206 can electrically couple the output of the primary stage 210 to one or more additional stages 220 of the amplifier. For example, the additional stages 220 can include an output stage, and zero or more intermediate stages. For example, as depicted, the primary stage amplifier output 206 couples to an additional stage 220 comprising a first 220A and second additional stage portion 220B for a respective signals of a differential pair. The first 220A and second additional stage portions 220B may electrically couple the outputs thereof to a first 230A and second output terminal 230B at an output stage of the amplifier. Although not separately enumerated, merely for clarity, the primary stage 210 of the amplifier 200 may also include a first and second portion, relating to the two portions of the differential signal. The depicted terminal connections, like other connections disclosed herein, may correspond to a pin, landing, control collapse chip connection, other chip connection, or an intermediate signal of a semiconductor device.

At a primary stage 210 of the amplifier 200, a pair of input signal ports 202 A-B introduce an input signal (depicted as a differential input signal) to the gates of two transistors being configured to produce a signal gain (e.g., a voltage or current gain). A pair of common mode reference input ports 204 receive a desired reference voltage at the gates of two additional transistors. The reference voltage may be a DC voltage which is a reference ground or offset therefrom, an AC sinusoidal voltage, or another reference common mode voltage. Although not depicted, the signals may be introduced to the gates of the respective transistors via an intermediate element, such as an inductor, series resistance, filter, fuse, protection diode, etc. The lack of any such intermediate elements is merely for clarity and simplicity of the figure, and is not intended to limit the disclosure. The common mode voltage is passed, by direct coupling, to an output of the primary stage of the amplifier 206 A-B (i.e., an inter-stage output), such that the output of the primary stage 206 A-B is caused to compensate for common mode interference which is thereby introduced to the amplifier by direct coupling. An "inter-stage output" may refer to a junction between two stages of an amplifier, according to some embodiments. For example, the junction can include a conductor such as a copper or aluminum interconnect joining the stages of the output. The inter-stage output may also referred to as an inter-stage input for a corresponding stage of the amplifier. For example, in the depicted embodiment, the input signal ports 202 and the common mode reference input ports 204 are delivered to the gates of pairs of respective transistors, and the respective transistor pairs are disposed inline, such that the two transistors pass the same current. In the depicted embodiment, no capacitively coupled feedback is provided at said input ports.

Various connections from resistor pairs 252A-B, corresponding to the common mode feedback impedance network 150C of FIG. 1, may be received at one or more pairs of feedback inputs 253 A-B. Such feedback inputs 253 A-B can intermediate or share a node with the input signal ports 202 or the common mode reference input ports 204. The associated resistor pairs 252 may include multiple instances thereof, or may depict various connections to a same resistor pair (e.g., resistor pair 152).

Referring now to an additional stage 220 of the amplifier 200, relatively high frequency components of the amplifier output comprising the common mode signal are capacitively coupled into current sources associated with (e.g., biasing) a class AB amplifier mesh 208 by capacitor pairs 254A-B. Such current sources may also be referred to as current mirrors. Similar inputs are introduced at a generally symmetrical circuit by capacitor pairs 254C-D, such that the common mode feedback is introduced to each of a side of the differential output. For example, high side current sources 222A-B, can couple the additional stage 220 of the amplifier to a supply voltage; low side current sources 224A-B can couple the additional stage 220 of the amplifier to a reference voltage. The class AB amplifier meshes 208 A-B may comprise additional amplification circuits/stages and/or biasing elements (e.g., resistors, diodes, and the like) intended to control the operation of another stage of an amplifier, such as an output stage. The second stage may receive high frequency common mode feedback via capacitor pairs 254 A-D. The various capacitor pairs 254 A-D may be a plurality of instances of a common mode feedback network (or, as discussed above, may be multiple depictions of connections from the same node) and may be received at one or more pairs of feedback inputs 255 A-D.

In many embodiments, at least a portion of the resistor pair feedback inputs 253 and/or capacitor pair feedback inputs are at different nodes of the amplifier 200, as is depicted. For example, the capacitor pair input can be disposed symmetrically across the additional stage 220 of the amplifier 200, within each differential side of the amplifier. Put differently, the capacitor pairs 254 can coupled to a voltage source gate and ground gate to cause the voltage source or ground gate to source or sink current therefrom, responsive to the feedback capacitively coupled through the capacitor pairs 254. Such pair may be symmetrically connected to each of a first 220A and second additional stage portion 220B of the differential amplifier 200.

As described herein, the additional stage 220 (e.g., a second stage and/or output stage of the amplifier 200), receives an input from the primary stage 210 (e.g., directly, or through intermediate stages or components) at an inter-stage input (i.e., the inter-stage output of the primary phase). The inter-stage input comprises the relatively low frequency common mode signals, as well as the relatively high frequency common mode signals at the gate transistor (e.g., through current biasing sources, the Class AB meshes 208, etc.) Thus, the additional stage 220 receives an input from the primary stage 210 having been conditioned by both the directly and capacitively coupled feedback signals.

The depicted amplifier is merely illustrative of an embodiment of this disclosure, and the implementation details are not intended to be limiting. Indeed, elements of the present disclosure may be practiced with various amplifiers. For example, any of the depicted transistors may be replaced with a Darlington pair, respective positions of the transistor pairs may be reversed, additional or fewer stages may be utilized, or the amplifier may include various transistors technologies and topologies (e.g., bipolar junction transistor (BJT), field effect transistor (FET), etc.). In some embodiments, two non-differential signals may be a victim of a common mode aggressor signal, and the present disclosure may be practiced to compensate for said common mode aggressor signal.

In some embodiments, such as where low frequency common mode interference is not present or not problematic, the direct coupled feedback portion may be omitted. Likewise, in applications where high frequency common mode interference is not present or not problematic, the capacitive coupled feedback portions may be omitted. Further, various references to a ground throughout this disclosure may be understood as a relative term and do not necessarily designate any particular ground (e.g., earth ground, chassis ground, etc.) Indeed, in some embodiments having a differential supply voltage (e.g., $+V_{cc}$ and $-V_{cc}$) one supply voltage may be designated as a local ground, which may simplify consideration and representation of the circuit. Further, it may be convenient to refer to multiple potentials as grounds in differing contexts, such that grounds discussed herein may be at different potentials.

Each of the primary amplifier stage 210 and additional amplifier stages 220 may be configured with a same or varying gain or bandwidth. For example, the gain of the first stage of the amplifier can be higher than an additional stage 220 of the amplifier, which may reduce an input current (e.g., increase input impedance which may avoid a distortion of input signals). A gain can be selected such that a range of frequencies wherein the current through the resistor pairs 252 A-D is not dominated by the current through the capacitor pairs 254 A-D is amplified by the primary amplifier stage 210. A gain of an additional amplifier stage 220 may be lower than the first stage. For example, a gain may be selected to avoid a non-linearity of amplification (e.g., high frequency input signals received via the capacitor pairs may be amplified). Put differently, a gain can be selected such that a range of frequencies wherein the current through the capacitor pairs 254 A-D is not dominated by the current through the resistor pairs 252 A-D. Corresponding to the reduced gain, the bandwidth of the additional stage 220 may exceed the bandwidth of the primary stage 210.

Figure 3:
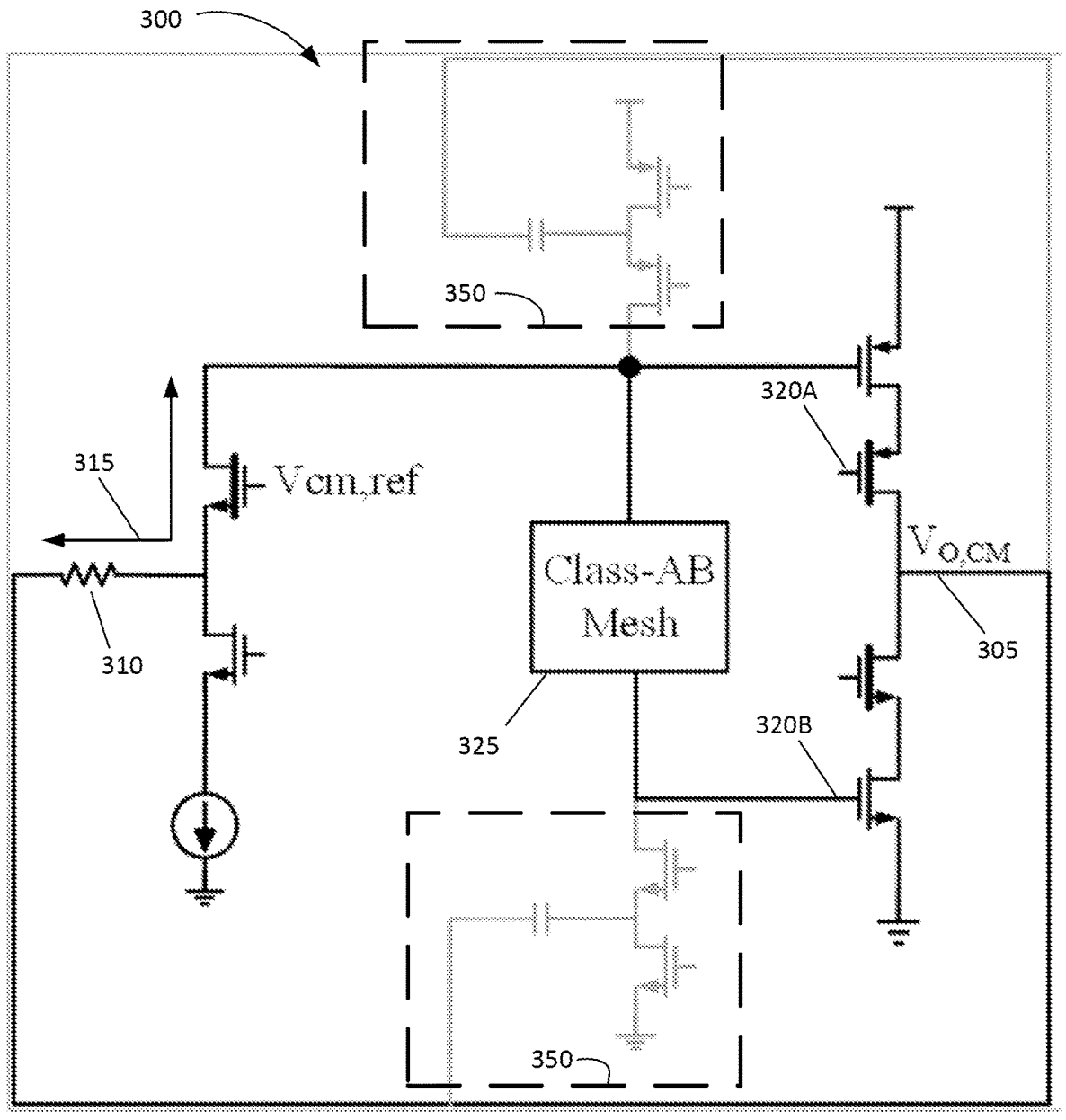
FIG. 3 is an illustration of a circuit depicting a directly coupled common mode feedback path, according to some implementations.

FIG. 3 is an illustration of an embodiment of a single ended amplifier circuit 300, intended to highlight the signal path of the relatively low frequency common mode component of a feedback signal. For example, FIG. 3 may be a simplified or reduced representation of the differential amplifier 200 of FIG. 2. Circuit portions of particular interest are shown and identified. The remaining circuit portions are may be less critical or can be neglected when considering certain low frequency signals. Said remaining circuit portions are shown bounded by delimiting lines 350.

An output 305 of the amplifier circuit 300 carries a signal having a common mode component, such as due to interference coupled onto a transmission cable. That signal is passed through one or more resistors 310 (e.g., disposed symmetrically between a differential pair to remove a differential component of the signal), which may damp the common mode component. The signal is coupled to a primary amplifier stage, such that the common mode current flowing to the primary stage 315 passes to an additional stage (through an inter-stage output). The additional stage may comprise further voltage and/or current amplification, such as by passing the common mode current flowing to the primary stage 315 to the gate of a transistor 320 A-B, directly or through a mesh 325. The mesh 325 may comprise biasing resistors and/or diodes, additional amplification stages, other feedback inputs, etc. At sufficiently low frequencies, the magnitude of a signal passed through the resistors may be substantially greater than (e.g., at least one order of magnitude) a magnitude of a signal capacitively coupled through the capacitors. Thus, the circuit operation of the circuits of FIG. 1, or 2 can be approximated by disregarding the capacitors. As described above, in some embodiments such capacitors can be omitted for designs which may not be sensitive or proximal to high frequency signals.

Figure 4:
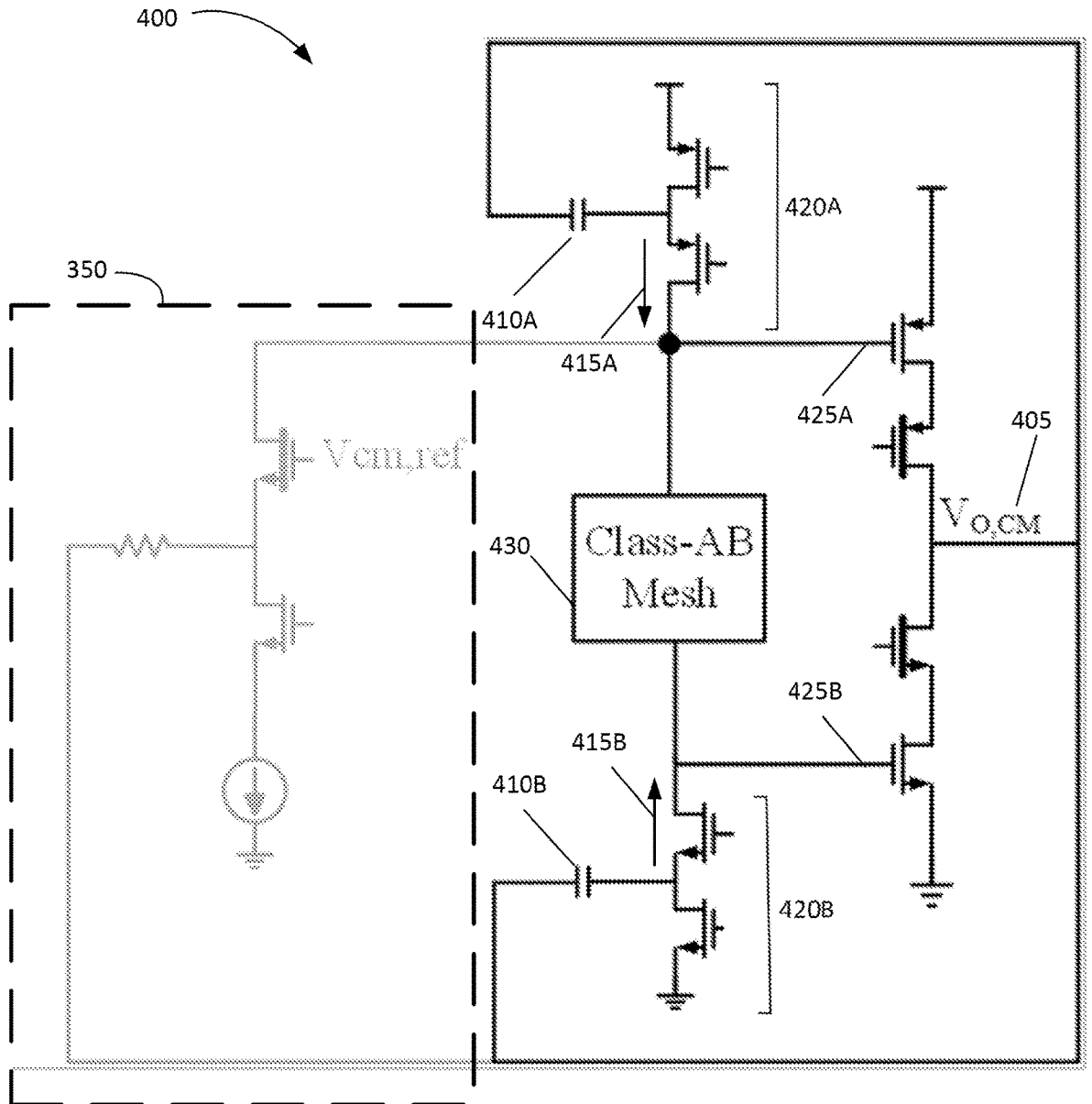
FIG. 4 is an illustration of a circuit depicting a capacitively coupled common mode feedback path, according to some implementations.

FIG. 4 depicts an embodiment of a single ended amplifier circuit 400 intended to highlight the signal path of the relatively high frequency common mode component of a feedback signal. For example, FIG. 4 may be a simplified or reduced representation of the amplifier of FIG. 2. Circuit portions of particular interest are shown and identified. The remaining circuit portions are may be less critical or can be neglected when considering certain high frequency signals. Said remaining circuit portions are shown bounded by delimiting lines 350.

An output 405 of the amplifier circuit 400 carries a signal having a common mode component, such as due to interference coupled onto a transmission cable. That signal is passed through one or more capacitors 410 (e.g., disposed symmetrically between a differential pair so as to remove a differential component of the signal). The signal is capacitively coupled to a pair of current supplies 420 A-B, which are connected to the gate of a transistor 425 A-B, (e.g., at an output stage of the amplifier 400). The transistor outputs may thereafter be gated by one or more additional transistors, such that a signal from a first transistor gate 425A sources current during times of positive operation, and a signal from a second transistor gate 425B sinks current during times of negative operation to complete a desired waveform. At sufficiently high frequencies, the magnitude of a signal passed through the resistors may be substantially less than (e.g., at least one order of magnitude) a magnitude of a signal capacitively coupled through the capacitors. Thus, the circuit operation of the circuits of FIG. 1, or 2 can be approximated by disregarding the resistors at certain frequencies. As described above, in some embodiments, such resistors can be omitted for designs which may not be sensitive or proximal to low frequency signals.

A class AB mesh 430 may comprise various biasing components in order to control the phase of operation of each of the transistors 425 A-B, such that the waveform is constructed which may be received by another device, (e.g., a complete or partial sinusoidal form). In some embodiments, the common mode currents 415 A-B may be further damped, amplified, biased, or otherwise conditioned by the Class AB mesh 430. In some embodiments, the Class AB mesh may be substantially symmetrical such that the path of the common mode signal through the mesh may be limited.

Figure 5:
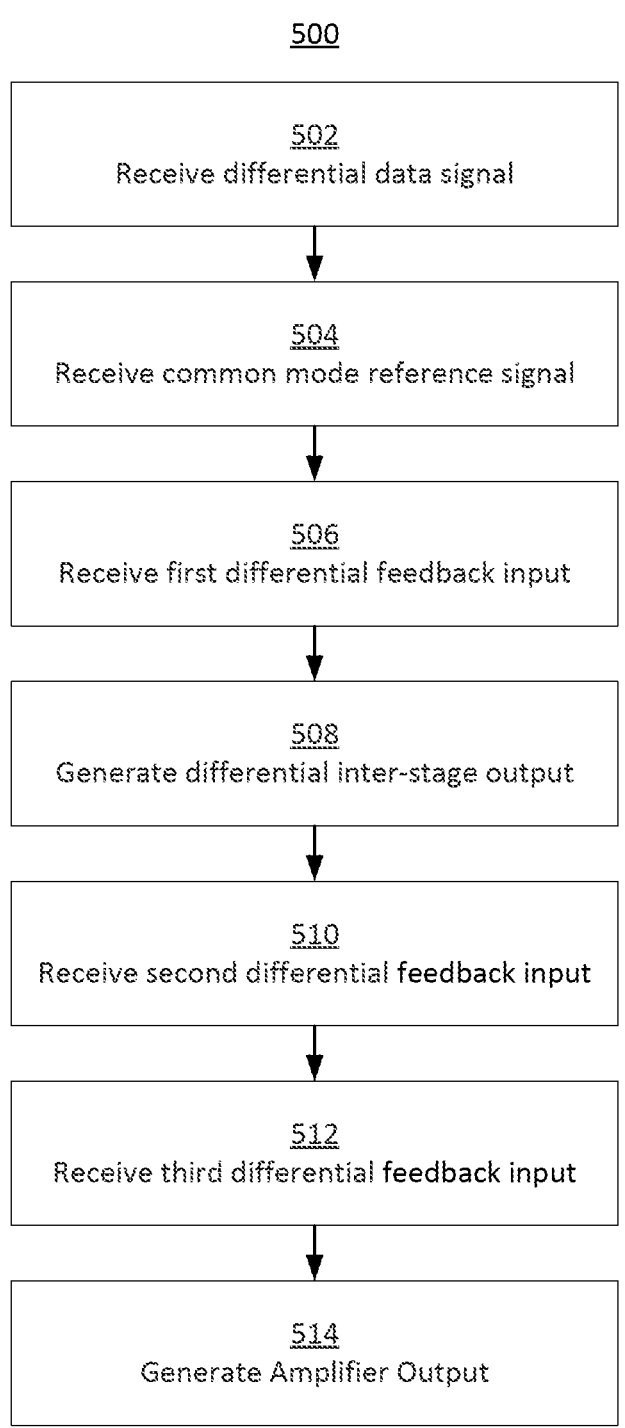
FIG. 5 is an flow diagram for a method for common mode suppression, according to some implementations.

Referring now to FIG. 5, a method 500 for common mode suppression is presented, according to some embodiments. In brief summary, the method 500 includes receiving a differential data signal at operation 502. At operation 504, a common mode reference signal can be received. At operation 506, a first differential feedback input is received by a first stage of an amplifier. At operation 508, a differential inter-stage output is generated. At operation 510, a second differential feedback is received at a second stage of the amplifier. At operation 512, a third differential feedback is received at the second stage of the amplifier. At operation 514, an output is generated. According to various embodiments, the operations described herein can be performed in various sequences, or operations can be added, omitted, substituted or modified. The method 500 can be employed with amplifiers disclosed herein, or other amplifiers. For example, the method 500 can be employed with different a common mode signal coupled to two single ended outputs.

Referring again to operation 502, a differential data signal is received. The differential data signal can include a digital or analog signal. For example, the differential data signal can be received from a twisted cable pair traversing an automotive vehicle (e.g., automotive Ethernet). The differential data signal can couple into the first input gates of an amplifier, such as directly from a transmission line or through a termination network. For example, the differential data signal can pass through transmission line termination proximal to the amplifier and to input terminals 202 therefrom. The first input gates can be a gate of a FET. The differential data signal can include common mode disturbances from other data or power signals of a vehicle.

Referring again to operation 504, a common mode reference signal can be received. For example, the common mode reference signal can be a DC voltage which is a reference ground or offset therefrom, an AC sinusoidal voltage, or another reference common mode voltage. The common mode input signal can be received at a gate of a FET. Said FET can connect a drain or source to a drain or source of the FET discussed with regard to operation 502.

Referring again to operation 506, first differential feedback input is received by a first stage of an amplifier. For example, the differential feedback input can be received intermediate to the first input gates of an amplifier and a common mode reference signal input. Put differently, the first differential feedback input can be connected to the junction of the respective source and drain of the FETs discussed with regard to operations 502 and 504. The differential feedback input can pass through a common mode feedback impedance network 150C, such as a resistor pair 152 thereof. The received differential data signal may vary from a common mode signal passed over the transmission line. For example, the differential feedback input received at the first stage of the amplifier may bias low frequency content of the common mode signal relative to high frequency signals which may be damped.

Referring again to operation 508, a differential inter-stage output is generated. For example, the inter-stage output can include a received differential signal including compensation for at least a portion of a common mode signal coupled there-into. For example, the inter-stage output can amplify the incoming signal and retain a portion of high frequency common mode signal which can thereafter be mitigated at operations 510 and 512.

Referring again to operations 510 and 512, second and third differential feedback inputs are received at the second stage of the amplifier. For example, the second and third differential feedback can correspond to capacitor pairs 154 coupling high frequency portions of the common mode signal. The second and third differential feedback inputs can adjust a current source biasing the second stage of the amplifier (e.g., though a class AB mesh such as a diode or resistor biasing element). Thus, the second stage of the amplifier can receive the signal from the first stage, and mitigate high frequency components of the common mode signal coupled to the signal.

Referring again to operation 514, an output is generated. The output can be generated by an output stage of the amplifier which can include further voltage gain, current gain, or otherwise generate an output signal at a voltage level and drive strength to interface with a predefined signal level. In various embodiments, the output stage can be a separate stage from the first and second stage, or can be, for example, the second stage.

B. Computing and Network Environment

Figure 6A:
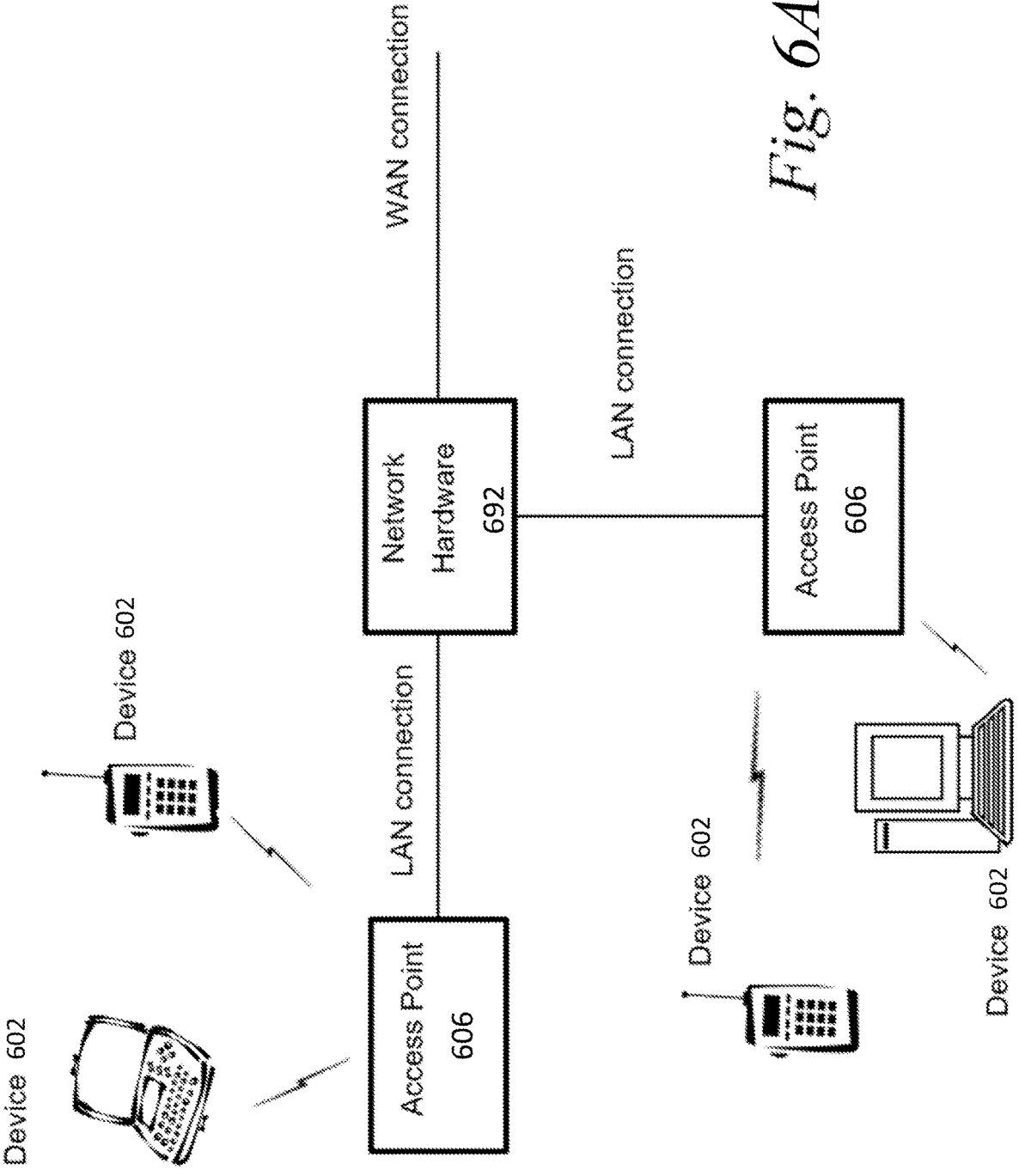
FIG. 6A is a block diagram depicting an embodiment of a network environment including one or more access points in communication with one or more devices or stations.

Having discussed specific embodiments of the present solution, it may be helpful to describe aspects of the operating environment as well as associated system components (e.g., hardware elements) in connection with the methods and systems described herein. Referring to FIG. 6A, an embodiment of a network environment is depicted. In brief overview, the network environment includes a wireless communication system that includes one or more access points 606, one or more wireless communication devices 602 and a network hardware component 692. The wireless communication devices 602 may for example include laptop computers 602, tablets 602, personal computers 602 and/or cellular telephone devices 602. The details of an embodiment of each wireless communication device and/or access point are described in greater detail with reference to FIGS. 6B and 6C. The network environment can be an ad hoc network environment, an infrastructure wireless network environment, a subnet environment, etc. in one embodiment The access points (APs) 606 may be operably coupled to the network hardware 692 via local area network connections. The network hardware 692, which may include a router, gateway, switch, bridge, modem, system controller, appliance, etc., may provide a local area network connection for the communication system. Each of the access points 606 may have an associated antenna or an antenna array to communicate with the wireless communication devices 602 in its area. The wireless communication devices 602 may register with a particular access point 606 to receive services from the communication system (e.g., via a SU-MIMO or MU-MIMO configuration). For direct connections (e.g., point-to-point communications), some wireless communication devices 602 may communicate directly via an allocated channel and communications protocol. Some of the wireless communication devices 602 may be mobile or relatively static with respect to the access point 606.

In some embodiments an access point 606 includes a device or module (including a combination of hardware and software) that allows wireless communication devices 602 to connect to a wired network using Wi-Fi, or other standards. An access point 606 may sometimes be referred to as an wireless access point (WAP). An access point 606 may be configured, designed and/or built for operating in a wireless local area network (WLAN). An access point 606 may connect to a router (e.g., via a wired network) as a standalone device in some embodiments. In other embodiments, an access point can be a component of a router. An access point 606 can provide multiple devices 602 access to a network. An access point 606 may, for example, connect to a wired Ethernet connection and provide wireless connections using radio frequency links for other devices 602 to utilize that wired connection. An access point 606 may be built and/or configured to support a standard for sending and receiving data using one or more radio frequencies. Those standards, and the frequencies they use may be defined by the IEEE (e.g., IEEE 802.11 standards). An access point may be configured and/or used to support public Internet hotspots, and/or on an internal network to extend the network's Wi-Fi signal range.

In some embodiments, the access points 606 may be used for (e.g., in-home or in-building) wireless networks (e.g., IEEE 802.11, Bluetooth, ZigBee, any other type of radio frequency based network protocol and/or variations thereof). Each of the wireless communication devices 602 may include a built-in radio and/or is coupled to a radio. Such wireless communication devices 602 and /or access points 606 may operate in accordance with the various aspects of the disclosure as presented herein to enhance performance, reduce costs and/or size, and/or enhance broadband applications. Each wireless communication devices 602 may have the capacity to function as a client node seeking access to resources (e.g., data, and connection to networked nodes such as servers) via one or more access points 606.

The network connections may include any type and/or form of network and may include any of the following: a point-to-point network, a broadcast network, a telecommunications network, a data communication network, a computer network. The topology of the network may be a bus, star, or ring network topology. The network may be of any such network topology capable of supporting the operations described herein. In some embodiments, different types of data may be transmitted via different protocols. In other embodiments, the same types of data may be transmitted via different protocols.

Figure 6B:
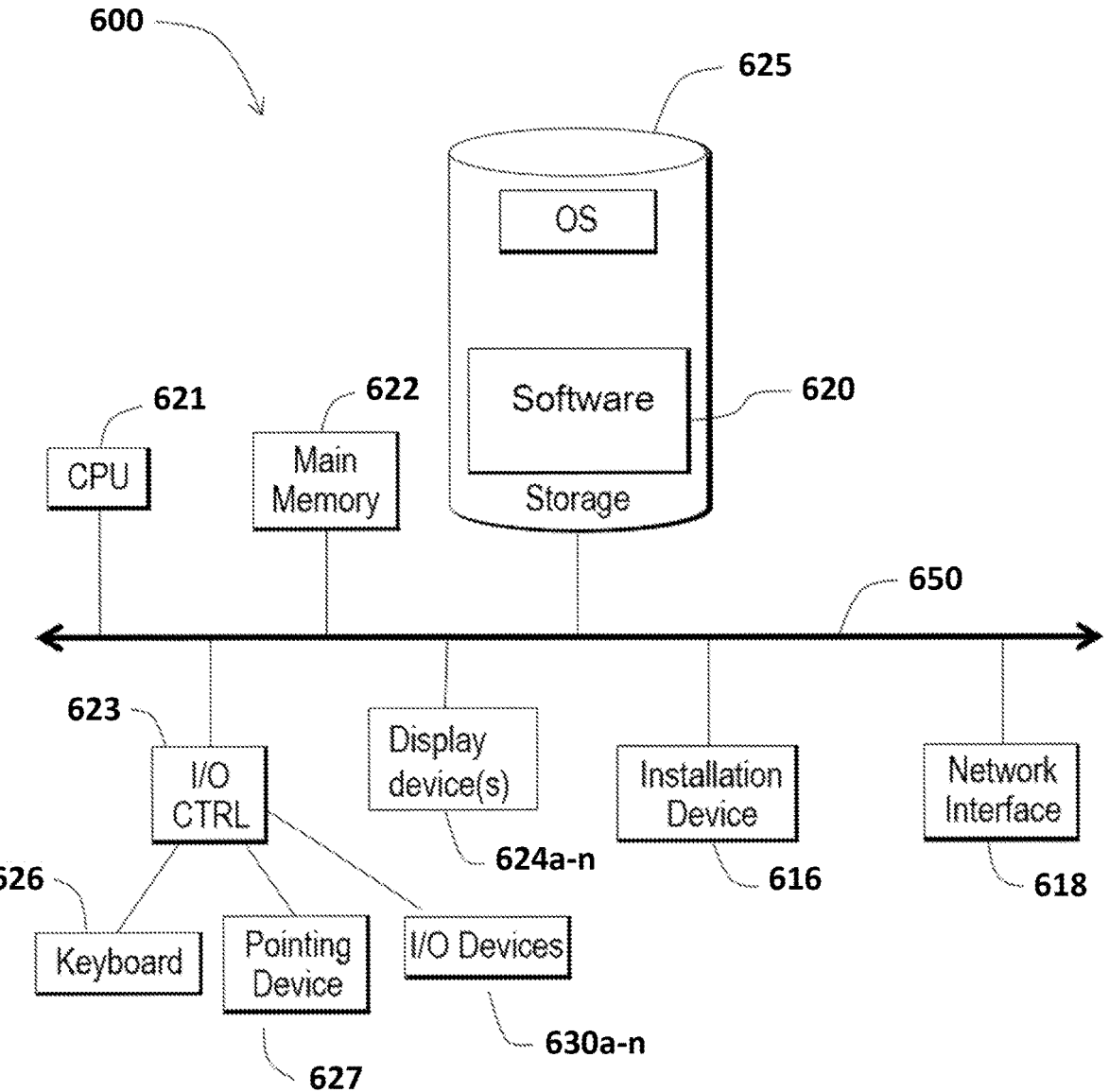
FIGS. 6B and 6C are block diagrams depicting embodiments of computing devices useful in connection with the methods and systems described herein.
Figure 6C:
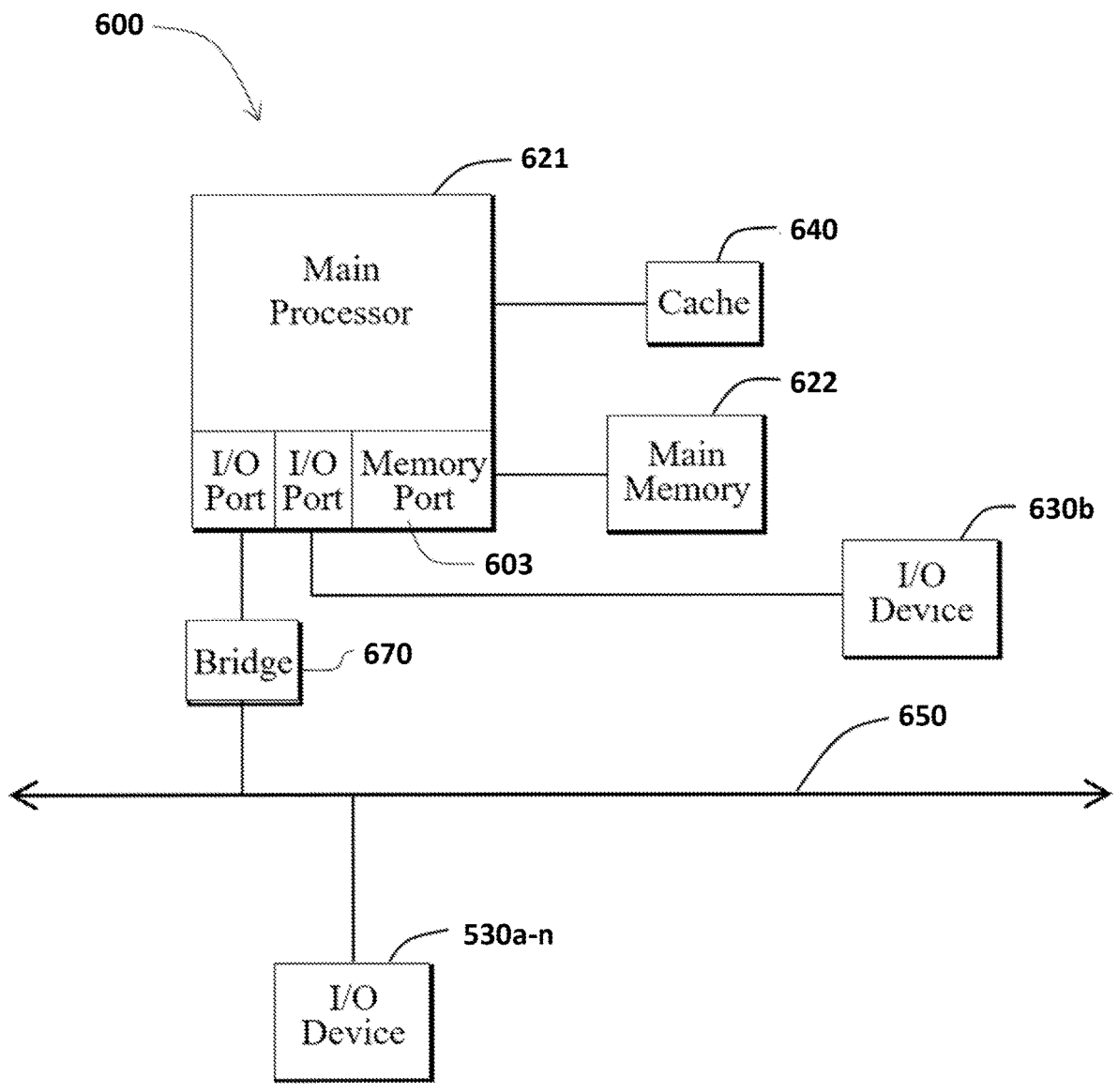

The communications device(s) 602 and access point(s) 606 may be deployed as and/or executed on any type and form of computing device, such as a computer, network device or appliance capable of communicating on any type and form of network and performing the operations described herein. FIGS. 6B and 6C depict block diagrams of a computing device 600 useful for practicing an embodiment of the wireless communication devices 602 or the access point 606. As shown in FIGS. 6B and 6C, each computing device 600 includes a central processing unit 621, and a main memory unit 622. As shown in FIG. 6B, a computing device 600 may include a storage device 628, an installation device 616, a network interface 618, an I/O controller 623, display devices 624a-624n, a keyboard 626 and a pointing device 627, such as a mouse. The storage device 628 may include, without limitation, an operating system and/or software. As shown in FIG. 6C, each computing device 600 may also include additional optional elements, such as a memory port 603, a bridge 670, one or more input/output devices 630a-630n (generally referred to using reference numeral 630), and a cache memory 640 in communication with the central processing unit 621.

The central processing unit 621 is any logic circuitry that responds to and processes instructions fetched from the main memory unit 622. In many embodiments, the central processing unit 621 is provided by a microprocessor unit, such as: those manufactured by Intel Corporation of Mountain View, California; those manufactured by International Business Machines of White Plains, New York; or those manufactured by Advanced Micro Devices of Sunnyvale, California. The computing device 600 may be based on any of these processors, or any other processor capable of operating as described herein.

Main memory unit 622 may be one or more memory chips capable of storing data and allowing any storage location to be directly accessed by the microprocessor 621, such as any type or variant of Static random access memory (SRAM), Dynamic random access memory (DRAM), Ferroelectric RAM (FRAM), NAND Flash, NOR Flash and Solid State Drives (SSD). The main memory 622 may be based on any of the above described memory chips, or any other available memory chips capable of operating as described herein. In the embodiment shown in FIG. 6B, the processor 621 communicates with main memory 622 via a system bus 650 (described in more detail below). FIG. 6C depicts an embodiment of a computing device 600 in which the processor communicates directly with main memory 622 via a memory port 603. For example, in FIG. 6C the main memory 622 may be DRDRAM.

FIG. 6C depicts an embodiment in which the main processor 621 communicates directly with cache memory 640 via a secondary bus, sometimes referred to as a backside bus. In other embodiments, the main processor 621 communicates with cache memory 640 using the system bus 650. Cache memory 640 typically has a faster response time than main memory 622 and is provided by, for example, SRAM, BSRAM, or EDRAM. In the embodiment shown in FIG. 6C, the processor 621 communicates with various I/O devices 630 via a local system bus 650. Various buses may be used to connect the central processing unit 621 to any of the I/O devices 630, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 624, the processor 621 may use an Advanced Graphics Port (AGP) to communicate with the display 624. FIG. 6C depicts an embodiment of a computer 600 in which the main processor 621 may communicate directly with I/O device 630b, for example via HYPERTRANSPORT, RAPIDIO, or INFINIBAND communications technology. FIG. 6C also depicts an embodiment in which local busses and direct communication are mixed: the processor 621 communicates with I/O device 630a using a local interconnect bus while communicating with I/O device 630b directly.

A wide variety of I/O devices 630a-630n may be present in the computing device 600. Input devices include keyboards, mice, trackpads, trackballs, microphones, dials, touch pads, touch screen, and drawing tablets. Output devices include video displays, speakers, inkjet printers, laser printers, projectors and dye-sublimation printers. The I/O devices may be controlled by an I/O controller 623 as shown in FIG. 6B. The I/O controller may control one or more I/O devices such as a keyboard 626 and a pointing device 627, e.g., a mouse or optical pen. Furthermore, an I/O device may also provide storage and/or an installation medium 616 for the computing device 600. In still other embodiments, the computing device 600 may provide USB connections (not shown) to receive handheld USB storage devices such as the USB Flash Drive line of devices manufactured by Twintech Industry, Inc. of Los Alamitos, California.

Referring again to FIG. 6B, the computing device 600 may support any suitable installation device 616, such as a disk drive, a CD-ROM drive, a CD-R/RW drive, a DVD-ROM drive, a flash memory drive, tape drives of various formats, USB device, hard-drive, a network interface, or any other device suitable for installing software and programs. The computing device 600 may further include a storage device, such as one or more hard disk drives or redundant arrays of independent disks, for storing an operating system and other related software, and for storing application software programs such as any program or software 620 for implementing (e.g., configured and/or designed for) the systems and methods described herein. Optionally, any of the installation devices 616 could also be used as the storage device. Additionally, the operating system and the software can be run from a bootable medium.

Furthermore, the computing device 600 may include a network interface 618 to interface to the network 604 through a variety of connections including, but not limited to, standard telephone lines, LAN or WAN links (e.g., 802.11, T1, T3, 56kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, CDMA, GSM, WiMax and direct asynchronous connections). In one embodiment, the computing device 600 communicates with other computing devices 600' via any type and/or form of gateway or tunneling protocol such as Secure Socket Layer (SSL) or Transport Layer Security (TLS). The network interface 618 may include a built-in network adapter, network interface card, PCMCIA network card, card bus network adapter, wireless network adapter, USB network adapter, modem or any other device suitable for interfacing the computing device 600 to any type of network capable of communication and performing the operations described herein.

In some embodiments, the computing device 600 may include or be connected to one or more display devices 624a-624n. As such, any of the I/O devices 630a-630n and/or the I/O controller 623 may include any type and/or form of suitable hardware, software, or combination of hardware and software to support, enable or provide for the connection and use of the display device(s) 624a-624n by the computing device 600. For example, the computing device 600 may include any type and/or form of video adapter, video card, driver, and/or library to interface, communicate, connect or otherwise use the display device(s) 624a-624n. In one embodiment, a video adapter may include multiple connectors to interface to the display device(s) 624a-624n. In other embodiments, the computing device 600 may include multiple video adapters, with each video adapter connected to the display device(s) 624a-624n. In some embodiments, any portion of the operating system of the computing device 600 may be configured for using multiple displays 624a-624n. A computing device 600 may be configured to have one or more display devices 624a-624n.

In further embodiments, an I/O device 630 may be a bridge between the system bus 650 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a FibreChannel bus, a Serial Attached small computer system interface bus, a USB connection, or a HDMI bus.

A computing device 600 of the sort depicted in FIGS. 6B and 6C may operate under the control of an operating system, which control scheduling of tasks and access to system resources. The computing device 600 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: Android, produced by Google Inc.; WINDOWS 7 and 8, produced by Microsoft Corporation of Redmond, Washington; MAC OS, produced by Apple Computer of Cupertino, California; WebOS, produced by Research In Motion (RIM); OS/2, produced by International Business Machines of Armonk, New York; and Linux, a freely-available operating system distributed by Caldera Corp. of Salt Lake City, Utah, or any type and/or form of a Unix operating system, among others.

The computer system 600 can be any workstation, telephone, desktop computer, laptop or notebook computer, server, handheld computer, mobile telephone or other portable telecommunications device, media playing device, a gaming system, mobile computing device, or any other type and/or form of computing, telecommunications or media device that is capable of communication. The computer system 600 has sufficient processor power and memory capacity to perform the operations described herein.

In some embodiments, the computing device 600 may have different processors, operating systems, and input devices consistent with the device. For example, in one embodiment, the computing device 600 is a smart phone, mobile device, tablet or personal digital assistant. In still other embodiments, the computing device 600 is an Android-based mobile device, an iPhone smart phone manufactured by Apple Computer of Cupertino, California, or a Blackberry or WebOS-based handheld device or smart phone, such as the devices manufactured by Research In Motion Limited. Moreover, the computing device 600 can be any workstation, desktop computer, laptop or notebook computer, server, handheld computer, mobile telephone, any other computer, or other form of computing or telecommunications device that is capable of communication and that has sufficient processor power and memory capacity to perform the operations described herein.

Although the disclosure may reference one or more "users", such "users" may refer to user-associated devices or stations (STAs), for example, consistent with the terms "user" and "multi-user" typically used in the context of a multi-user multiple-input and multiple-output (MU-MIMO) environment.

Although examples of communications systems described above may include devices and APs operating according to an 802.11 standard, it should be understood that embodiments of the systems and methods described can operate according to other standards and use wireless communications devices other than devices configured as devices and APs. For example, multiple-unit communication interfaces associated with cellular networks, satellite communications, vehicle communication networks, and other non-802.11 wireless networks can utilize the systems and methods described herein to achieve improved overall capacity and/or link quality without departing from the scope of the systems and methods described herein.

It should be noted that certain passages of this disclosure may reference terms such as "first" and "second" in connection with devices, mode of operation, transmit chains, antennas, etc., for purposes of identifying or differentiating one from another or from others. These terms are not intended to merely relate entities (e.g., a first device and a second device) temporally or according to a sequence, although in some cases, these entities may include such a relationship. Nor do these terms limit the number of possible entities (e.g., devices) that may operate within a system or environment.

It should be understood that the systems described above may provide multiple ones of any or each of those components and these components may be provided on either a standalone machine or, in some embodiments, on multiple machines in a distributed system. In addition, the systems and methods described above may be provided as one or more computer-readable programs or executable instructions embodied on or in one or more articles of manufacture. The article of manufacture may be a floppy disk, a hard disk, a CD-ROM, a flash memory card, a PROM, a RAM, a ROM, or a magnetic tape. In general, the computer-readable programs may be implemented in any programming language, such as LISP, PERL, C, C++, C#, PROLOG, or in any byte code language such as JAVA. The software programs or executable instructions may be stored on or in one or more articles of manufacture as object code.

The term "coupled" and variations thereof, as used herein, means the connection of two elements directly or indirectly to one another. Such connections may be achieved with two elements coupled directly to each other, with the two elements coupled to each other using a separate intervening member and any additional intermediate elements coupled with one another, or with the two elements coupled to each other using an intervening member that is integrally formed as a single unitary body with one of the two elements. If "coupled" or variations thereof are modified by an additional term (e.g., directly coupled), the generic definition of "coupled" provided above is modified by the plain language meaning of the additional term (e.g., "directly coupled" means the joining of two elements without any separate intervening member), resulting in a narrower definition than the generic definition of "coupled" provided above. Such coupling may be mechanical, electrical, or fluidic.

While the foregoing written description of the methods and systems enables one of ordinary skill to make and use what is considered presently to be the best mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

18

We claim:

1. A device, comprising:
an amplifier, comprising:
   a first amplifier stage, comprising:
      a pair of first input ports configured to receive a differential input signal at a first pair of gates of a first pair of transistors,
      a pair of second input ports configured to receive a common mode reference at a second pair of gates of a second pair of transistors, and
      a first pair of inter-stage outputs configured to deliver a pair of amplified signals from the first amplifier stage to a pair of gates of a third pair of transistors of a second amplifier stage; and
   the second amplifier stage, further comprising:
      a first pair of current sources, and
      a second pair of current sources,
   a feedback network coupled between an output of the amplifier and the first amplifier stage or the second amplifier stage, the feedback network comprising:
      a first pair of feedback inputs directly coupled to the first amplifier stage, or
      a second pair of feedback inputs capacitively coupled to the first pair of current sources, or
      a third pair of feedback inputs capacitively coupled to the second pair of current sources.

2. The device of claim 1, wherein the feedback network comprises:
   the first pair of feedback inputs directly coupled to the first amplifier stage; and
   the second pair of feedback inputs capacitively coupled to the first pair of current sources; and
   the third pair of feedback inputs capacitively coupled to the second pair of current sources.

3. The device of claim 2, wherein:
   each of the first pair of feedback inputs, the second pair of feedback inputs, and the third pair of feedback inputs couple to the output of the amplifier proximal to the amplifier relative to a termination network of a transmission line coupled thereto.

4. The device of claim 2, wherein:
   a gain of the first amplifier stage exceeds a gain of the second amplifier stage; and
   a bandwidth of the second amplifier stage exceeds a bandwidth of the first amplifier stage.

5. The device of claim 2, wherein:
   the feedback network and the amplifier are integral to a same semiconductor device.

6. The device of claim 2, wherein:
   the amplifier is integral to a semiconductor device configured to interface with the feedback network comprising a discrete resistor pair and a discrete capacitor pair.

7. The device of claim 3, wherein:
   the termination network includes a common mode choke and a low pass filter.

8. The device of claim 1, wherein:
   the first pair of feedback inputs, the second pair of feedback inputs, or the third pair of feedback inputs connect to the output of the amplifier proximal to the amplifier relative to a termination network of a transmission line coupled thereto, the transmission line comprising an unshielded twisted pair corresponding to the output of the amplifier; and
   the termination network includes a common mode choke and a low pass filter.

9. A system, comprising:

a first amplifier stage of an amplifier, comprising:

a pair of first input ports configured to receive a differential input signal at a first pair of gates of a first pair of transistors, a pair of second input ports configured to receive a common mode reference at a second pair of gates of a second pair of transistors, and a first pair of inter-stage outputs configured to deliver a pair of amplified signals from the first amplifier stage to a pair of gates of a third pair of transistors of a second amplifier stage; and the second amplifier stage, further comprising:

a first pair of high side current sources, and a second pair of low side current sources, a feedback network coupled between an output of the amplifier and the first amplifier stage or the second amplifier stage, the feedback network comprising:

a first pair of feedback inputs directly coupled to the first amplifier stage;

a second pair of feedback inputs capacitively coupled to the first pair of high side current sources; and a third pair of feedback inputs capacitively coupled to the second pair of low side current sources.

10. The system of claim 9, wherein:

each of the first pair of feedback inputs, the second pair of feedback inputs, and the third pair of feedback inputs connect to the output of the amplifier proximal to the amplifier relative to a termination network of a transmission line coupled thereto.

11. The system of claim 9, wherein:

a gain of the first amplifier stage exceeds a gain of the second amplifier stage; and a bandwidth of the second amplifier stage exceeds a bandwidth of the first amplifier stage.

12. The system of claim 9, wherein:

the feedback network and the amplifier are integral to a same semiconductor device.

13. The system of claim 9, wherein:

the amplifier is integral to a semiconductor device configured to interface with the feedback network comprising a discrete resistor pair and a discrete capacitor pair.

14. The system of claim 10, wherein:

the termination network includes a common mode choke and a low pass filter.

15. A method, comprising:

receiving, at a first stage of an amplifier:

a differential data signal at first input gates of first transistors of respective portions of the first stage;

a common mode reference signal at second input gates of second transistors of respective portions of the first stage; and a first differential feedback input at third inputs intermediate to the first transistors and the second transistors;

generating, by the first stage of the amplifier:

a differential inter-stage output based on the differential data signal, the common mode reference signal, and the first differential feedback input;

receiving, by a second stage of the amplifier:

a second differential feedback input at a high side current source at respective portions of the second stage;

a third differential feedback input at a low side current source at respective portions of the second stage, wherein the differential inter-stage output intermediate to the high side current source and the low side current source at respective portions of the second stage;

generating, by the second stage of the amplifier, an output based on the differential inter-stage output, the second differential feedback input, and the third differential feedback input.

16. The method of claim 15, wherein:

each of the first differential feedback input, the second differential feedback input, and the third differential feedback input connect to the output of the amplifier proximal to the amplifier relative to a termination network of a transmission line coupled thereto.

17. The method of claim 15, wherein:

a gain of the first stage exceeds a gain of the second stage; and a bandwidth of the second stage exceeds a bandwidth of the first stage.

18. The method of claim 15, wherein:

the amplifier and a feedback network are integral to a same semiconductor device, the feedback network coupling the output of the amplifier to the first differential feedback input, the second differential feedback input, and the third differential feedback input.

19. The method of claim 15, wherein:

the amplifier is integral to a semiconductor device configured to interface with a feedback network comprising a discrete resistor pair and a discrete capacitor pair.

20. The method of claim 16, wherein:

the termination network includes a common mode choke and a low pass filter.

* * * * *